(12) United States Patent
Iguchi et al.

(10) Patent No.: US 6,689,535 B2
(45) Date of Patent: Feb. 10, 2004

(54) ANTI-REFLECTIVE COATING COMPOSITION, MULTILAYER PHOTORESIST MATERIAL USING THE SAME, AND METHOD FOR FORMING PATTERN

(75) Inventors: Etsuko Iguchi, Tokyo (JP); Takeshi Tanaka, Kanagawa-ken (JP); Kazumasa Wakiya, Kanagawa-ken (JP)

(73) Assignee: Tokyo Ohka Kogyo Co., LTD, Kawasaki (JP)

( * ) Notice: Subject to any disclaimer, the term of this patent is extended or adjusted under 35 U.S.C. 154(b) by 0 days.

(21) Appl. No.: 09/986,673

(22) Filed: Nov. 9, 2001

(65) Prior Publication Data

US 2002/0055064 A1 May 9, 2002

(30) Foreign Application Priority Data

Nov. 9, 2000 (JP) ........................................ 2000-342044

(51) Int. Cl.$^7$ ................................................ G03F 7/003
(52) U.S. Cl. .................. 430/270.1; 430/325; 430/271.1
(58) Field of Search .......................... 430/271.1, 270.1, 430/325

(56) References Cited

U.S. PATENT DOCUMENTS 6,323,310 B1 * 11/2001 Puligadda et al. .......... 528/423
6,503,689 B2 * 1/2003 Zampini et al. ......... 430/270.1

* cited by examiner

*Primary Examiner*—Rosemary Ashton
(74) *Attorney, Agent, or Firm*—Wenderoth, Lind & Ponack, L.L.P.

(57) ABSTRACT

Disclosed is an anti-reflective coating composition for forming an anti-reflective coating as an undercoating layer is provided, comprising a crosslinking agent, which is at least one compound selected from nitrogen-containing compounds having an amino group(s) and/or an imino group(s) at least two hydrogen atoms of which are substituted by a hydroxyalkyl group(s) and/or an alkoxyalkyl group(s), and an acidic compound, wherein the crosslinking agent is such that the proportion of its low-molecular-weight component not larger than a trimer is adjusted to be 15 wt % or less; a multilayer photoresist material using the composition; and a method for forming a pattern. According to the present invention, even in the formation of a hyperfine pattern, it is possible to provide a photoresist pattern having a rectangular cross-sectional profile in relation to the substrate without causing any undesirable phenomena, such as footing, undercutting, etc. at is bottom.

8 Claims, No Drawings

ANTI-REFLECTIVE COATING COMPOSITION, MULTILAYER PHOTORESIST MATERIAL USING THE SAME, AND METHOD FOR FORMING PATTERN

BACKGROUND OF THE INVENTION

1. Field of the Invention

The present invention relates to a composition for forming an anti-reflective coating which is provided onto a substrate and is, in turn, overlaid with a photoresist layer in the field of photolithography, a multilayer photoresist material using the same, and a method for forming a pattern. More particularly, the present invention relates to a bottom layer anti-reflective coating composition which is capable of forming a photoresist pattern having a rectangular profile without causing any undesirable phenomena, such as footing occurred at its bottom, even when forming a hyperfine photoresist pattern using a short-wavelength light source of from vacuum ultraviolet radiation to extreme-ultraviolet radiation typified by excimer laser beams, a multilayer photoresist material using the composition, and a method for forming a pattern.

2. Description of Related Art

In general, the fabrication of semiconductor devices utilizing photolithography involves providing a bottom layer anti-reflective coating or film between a substrate and a photoresist layer ("BARC method"). This is achieved to prevent, when patterning, standing waves resulting from the reflection of exposure light at the substrate from causing notching (local deformation), etc.

Recent advances in microlithography of semiconductor integrated circuits bearing finer patterns led to the trend toward the irradiation of rays of shorter wavelengths, and excimer laser beams, such as KrF, ArF and $F_2$ have come into use. A variety of three-component-type compositions have been investigated as the antireflective film-forming composition, where the excimer laser beams are used as light sources for exposure. The principal components of the composition are a resin for forming a coat (base resin), a light-absorptive component for absorbing reflected light, and a crosslinking agent for thermally crosslinking these components. For example, there have been proposed photolithography undercoating materials each containing: a crosslinking agent substituted by a hydroxyalkyl or alkoxyalkyl group; a benzophenone-, diphenylsulfone-, or sulfoxide-type dye; and an acrylic resin (Japanese Patent Application Laid-Open Nos. 8-87115, 9-292715, and 10-228113, etc.).

Furthermore, in recent years, it has been proposed to provide the coat-forming resin with light-absorptive by introducing a light-absorptive substituent(s) into its molecular structure. Examples of such resins that are obtainable by such technique include: an anti-reflective coating composition composed of a binder resin containing a quinolinyl group, a quinolinyl derivative group having a cyclic substituent with nitrogen, oxygen, or sulfur as a hetero atom, a phenanthrenyl group, an acridinyl group, or an alkyleneanthryl group, and a crosslinking agent constituted of glycoluryl and the like (Japanese Patent Application Laid-Open No. 10-204328); and an anti-reflective coating composition the principal constituents of which are a resin obtained by polymerizing an epoxy resin with a dye substituted by a group having an anthracene or naphthalene ring and a crosslinking agent such as a melamine resin, a urea resin, a benzoguanamine resin, and a glycoluryl resin (WO 97/07145).

In case of a pattern with a conventional fineness, adverse effects due to standing waves can be inhibited through the use of such conventional undercoating material or coating composition described above, leading to the formation of a photoresist pattern having an improved profile. However, since the formation of finer patterns requires further improvement in processing precision, it is hard to provide fully satisfactory results. In fact, the formation of a finer pattern with a line width of not more than 0.22 $\mu$m using said conventional undercoating material or coating composition, and a KrF excimer laser beam (wavelength: 248 nm) as a light source for exposure resulted in the occurrence of footing at its bottom or T-topping, and consequently failed in providing a photoresist pattern having a rectangular cross-section to the substrate. Poor patterning may lead to degradation in resolution.

Therefore, there has arisen a pressing need to develop such an anti-reflective coating as to realize the formation of a photoresist pattern having a rectangular cross-sectional profile in relation to the substrate even when forming a hyperfine pattern using a short-wavelength ray like KrF, ArF, or $F_2$ laser beam as a light source.

SUMMARY OF THE INVENTION

The present invention was accomplished under such circumstances as was described above.

An object, therefore, of the present invention is to provide an anti-reflective coating composition which realizes the formation of a photoresist pattern having a rectangular cross-sectional profile in relation to the substrate without causing footing or T-topping at its bottom even when an excimer laser beam or the like is employed as a light source for achieving increased fineness of patterning of about 0.20–0.22 $\mu$m in width.

Another object of the invention is to provide a multilayer photoresist material using the anti-reflective coating composition.

Still another object of the invention is to provide a method for forming a pattern.

For achieving the objects described above, the present invention provides an anti-reflective coating composition comprising: a crosslinking agent which is at least one compound selected from nitrogen-containing compounds having an amino group(s) and/or an imino group(s) at least two hydrogen atoms of which are substituted by a hydroxyalkyl group(s) and/or an alkoxyalkyl group(s); and an acidic compound. In this composition, the crosslinking agent is such that the proportion of its low-molecular-weight component not larger than a trimer is adjusted so as to be 15 wt % or less.

Moreover, the present invention provides a multilayer photoresist material produced by forming an anti-reflective coating onto a substrate using the above-described anti-reflective coating composition and providing a photoresist layer thereon.

Furthermore, the present invention provides a method for forming a pattern which comprises forming an anti-reflective coating from the anti-reflective coating composition described above onto a substrate, providing a photoresist layer thereon, selectively exposing the photoresist layer to light, and developing the photoresist layer to give a photoresist pattern.

DETAILED DESCRIPTION OF THE INVENTION

Hereinafter, the present invention will be described in further detail.

The crosslinking agent employed according to the present invention is selected from nitrogen-containing compounds having an amino group(s) and/or an imino group(s) at least two hydrogen atoms of which are substituted by a hydroxyalkyl group(s) and/or an alkoxyalkyl group(s), and that the proportion of its low-molecular-weight component not larger than a trimer has been adjusted so as to be 15 wt % or less.

Exemplified such nitrogen-containing compound include melamine-, urea-, guanamine-, acetoguanamine-, benzoguanamine-, and succinylamide compounds in which the hydrogen atoms of an amino group(s) are substituted by methylol groups, alkoxymethyl groups, or methylol and alkoxymethyl groups; and glycoluryl or ethylene urea compounds in which the hydrogen atom of an imino group is substituted.

These nitrogen-containing compounds are obtainable by, for example, allowing a melamine compound, a urea compound, a guanamine compound, an acetoguanamine compound, a benzoguanamine compound, a succinylamide compound, a glycoluryl compound, or an ethylene urea compound to react with formalin in boiling water for methylolation, or by further alkoxylating the obtained reaction product through the reaction with a lower alcohol concrete examples of which are methanol, ethanol, n-propanol, isopropanol, n-butanol, and isobutanol, etc.

Of these nitrogen-containing compounds, preferred ones are benzoguanamine-, guanamine-, melamine-, and urea compounds in which at least two hydrogen atoms of the amino group(s) have been substituted by methylol groups, (lower alkoxy)methyl groups, or methylol and (lower alkoxy)methyl groups. More preferred are triazine compounds, such as benzoguanamine compounds, guanamine compounds and melamine compounds. Of these, much more preferred are those having, on average, from 3 or more to less than 6 methylol or (lower alkoxy) methyl groups per one triazine ring.

Concrete examples of such nitrogen-containing compounds include benzoguanamine compounds, such as methoxymethylated benzoguanamine compound commercially available as MX-750 in which the number of substituting methoxymethyl groups per one triazine ring is 3.7 on average, benzogunamine compound commercially available as SB-203, isobutoxymethylated benzoguanamine compound commercially available as BX-55H (these are all products of Sanwa Chemical Co., Ltd.), and methoxymethylated ethoxymethylated benzoguanamine compound commercially available as Cymel 1125 (manufactured by Mitsui Cyanamid Co.); and melamine compounds such as methoxymethylated melamine compound commercially available under the tradename MX-788 (manufactured by Sanwa Chemical Co., Ltd.) and methoxymethylated isobutoxymethylated melamine compound commercially available as Cymel 1141 (manufactured by Mitsui Cyanamid Co., Ltd.). Moreover, examples of glycoluryl compounds include methylolated glycoluryl compounds which are commercially available as Cymel 1172 (manufactured by Mitsui Cyanamid Co., Ltd.).

Of the nitrogen-containing compounds listed above, the crosslinking agent employed in the present invention is one having a low-molecular-weight component content not larger than a trimer adjusted to 15 wt % or less, more preferably 10 wt % or less. As described above, the shape of the bottom part of a photoresist pattern can be improved by adjusting the content of a low-molecular-weight component (s) not larger than a trimer (low-molecular-weight fraction). When forming a hyperfine photoresist pattern, the use of a crosslinking agent having a low-molecular-weight component content of more than 15 wt % leads to the deterioration of the resulting pattern in shape.

To be more concrete, in the case where a benzoguanamine compound is used as the nitrogen-containing compound, it is preferred that the low-molecular weight fraction the molecular weight of which is as low as about 800 or less is omitted from the crosslinking agent so that its content in the crosslinking agent is 15 wt % or less.

Moreover, when using a melamine compound as the nitrogen-containing compound, it is preferred that the low-molecular-weight fraction the molecular weight of which is as low as about 500 or less is omitted from the crosslinking agent so that its content is not more than 15 wt %.

There is no particular restriction as to the way of omitting the low-molecular-weight fraction, and a conventionally known technique can be employed. For example, an omission of the low-molecular-weight fraction may preferably be effected through separation with a solvent. In the present invention, the low-molecular-weight fraction was omitted from the crosslinking agent through separation with methanol, and the separation was effected by omitting the methanol-dissolved portions and collecting the methanol-undissolved portions.

The amount of the crosslinking agent is preferably 0.5–30 wt % relative to the total amount of the anti-reflective coating composition, particularly 1–15 wt %.

Exemplary acidic compounds used in the present invention include an inorganic or organic acid having a sulfur-containing acid residue, an ester thereof, and a compound which generates an acid upon exposure to active rays (acid-generating agents). These acidic compounds have several advantageous effects, such as promotion of the crosslinking between crosslinking agents, improvement of the profile of the bottom part of the pattern, and allowing a reduction in baking temperature which consequently makes it possible to simplify the process.

Exemplary inorganic acid having a sulfur-containing acid residue include sulfuric acid, sulfurous acid, and thiosulfuric acid. Among them, sulfuric acid is particularly preferred. Exemplified as the organic acid having a sulfur-containing acid residue are organic sulfonic acids, and further, examples of the ester thereof include organic sulfuric acid esters and organic sulfurous acid esters. Of these, particularly preferred are organic sulfonic acids, for example, those represented by the following general formula (I):

$$R^1\text{—} \qquad\qquad (I)$$

wherein $R^1$ represents a hydrocarbon group which may have or may not have a substituent, and X represents a sulfonic acid group.

In the general formula (I), $R^1$ is preferably a hydrocarbon group having 1–20 carbon atoms, and said hydrocarbon group may be saturated or unsaturated, and linear, branched, or cyclic. Exemplary of the substituent are a halogen atom typified by fluorine atom, sulfonic acid group, carboxyl group, hydroxyl group, amino group, and cyano group, and one or a plurality of these can be introduced thereto.

Exemplary group denoted by $R^1$ are aromatic hydrocarbon groups, such as phenyl group, naphthyl group, and anthryl group. Of these, phenyl group is preferred.

Moreover, one or a plurality of alkyl groups having 1–20 carbon atoms may be bonded to the aromatic ring of such aromatic hydrocarbon group. In addition, the aromatic ring may be substituted with one or a plurality of substituents, such as halogen atoms typified by fluorine atom, sulfonic acid group, carboxyl group, hydroxyl group, amino group, and cyano group.

From the viewpoint of improvement of the shape of the bottom part of the photoresist pattern, particularly suitable as such organic sulfonic acid is nonafluorobutane sulfonic acid, methane sulfonic acid, trifluoromethane sulfonic acid, dodecylbenzene sulfonic acid, p-toluenesulfonic acid, or a mixture of these.

Examples of the acid-generating agent include the following compounds.

(a) bissulfonyldiazomethanes, such as bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsul-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane, and bis(4-tert-butylphenylsulfonyl)diazomethan;

(b) nitrobenzyl derivatives, such as p-toluenesulfonic acid-2-nitrobenzyl, p-toluenesulfonic acid-2,6-dinitrobenzyl, and p-trifluoromethylbenzenesulfonic acid-2,4-dinitrobenzyl;

(c) aliphatic or aromatic sulfonic acid esters of polyhydroxy compounds, such as methane sulfonic acid esters of pyrogallol (pyrogallol trimesilate), benzenesulfonic acid esters of pyrogallol, p-toluenesulfonic acid esters of pyrogallol, p-methoxybenzenesulfonic acid esters of pyrogallol, mesitylenesulfonic acid esters of pyrogallol, benzylsulfonic acid esters of pyrogallol, methane sulfonic acid esters of alkyl gallates, benzenesulfonic acid esters of alkyl gallates, p-toluenesulfonic acid esters of alkyl gallates, p-methoxybenzenesulfonic acid esters of alkyl gallates, mesitylenesulfonic acid esters of alkyl gallates, and benzylsulfonic acid esters of alkyl gallates;

(d) onium salts such as diphenyliodonium tetrafluoroborate, diphenyliodonium hexafluorophosphate, diphenyliodonium hexafluoroantimonate, diphenyliodonium trifluoromethanesulfonate, (4-methoxyphenyl)phenyliodonium hexafluoroantimonate, (4-methoxyphenyl)phenyliodonium trifluoromethanesulfonate, bis(p-tert-butylphenyl)iodonium tetrafluoroborate, bis(p-tert-butylphenyl)iodonium hexafluorophosphate, bis(p-tert-butylphenyl)iodonium hexafluoroantimonate, bis(p-tert-butylphenyl)iodonium trifluoromethanesulfonate, triphenylsulfonium hexafluorophosphate, triphenylsulfonium hexafluoroantimonate, and triphenylsulfonium trifluoromethanesulfonate;

(e) sulfonyl carbonyl alkanes, such as 2-methyl-2-(p-toluenesulfonyl)propionphenone, 2-(cyclohexylcarbonyl)-2-(p-toluenesulfonyl)propane, 2-methanesulfonyl-2-methyl-(4-methylthio)propionphenone, and 2,4-dimethyl-2-(p-toluenesulfonyl)pentan-3-one;

(f) sulfonyl carbonyl diazomethanes, such as 1-p-toluenesulfonyl-1cyclohexylcarbonyldiazomethane, 1-diazo-1methylsulfonyl-4-phenyl-2-butanone, 1-cyclohexylsulfonyl-1cyclohexylcarbonyldiazomethane, 1-diazo-1cyclohexylsulfonyl-3,3-dimethyl-2-butanone, 1-diazo-1(1,1-dimethylethylsulfonyl)-3,3-dimethyl-2-butanone, 1-acetyl-1(1-methylethylsulfonyl)diazomethane, 1-diazo-1(p-toluenesulfonyl)-3,3-dimethyl-2-butanone, 1-diazo-1benzenesulfonyl-3,3-dimethyl-2-butanone, 1-diazo-1(p-toluenesulfonyl)-3-methyl-2-butanone, 2-diazo-2-(p-toluenesulfonyl)cyclohexyl acetate, 2-diazo-2-(benzenesulfonyl)tert-butyl acetate, 2-diazo-2-methanesulfonyl isopropyl acetate, 2-diazo-2-benzenesulfonyl cyclohexyl acetate, and 2-diazo-2-(p-toluenesulfonyl)tert-butyl acetate;

(g) benzoin tosylates such as benzoin tosylate, and α-methylbenzoin tosylate;

(h) halogen-containing triazine compounds, such as 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine, and tris(2,3-dibromopropyl)isocyanurate;

(i) oxime sulfonates, such as α-(methylsulfonyloxyimino)phenyl acetonitrile, α-(toluenesulfonyloxyimino)phenyl acetonitrile, α-(p-chlorobenzenesulfonyloxyimino)phenyl acetonitrile, α-4-nitrobenzenesulfonyloxyimino)phenyl acetonitrile, α-(4-nitro-2-trifluoromethylbenzenesulfonyloxyimino)phenyl acetonitrile, α-(methylsulfonyloxyimino)-1-phenyl acetonirile, α-(methylsulfonyloxyimino)-4-methoxyphenyl acetonitrile, α-(methylsulfonyloxyimino)-1-(p-methylphenyl)acetonitrile, α-(methylsulfonyloxyimino)-1 (p-methoxyphenyl)acetonitrile, α-(benzenesulfonyloxyimino)-4-chlorophenyl acetonitrile, α-(benzenesulfonyloxyimino)-2,4-dichlorophenyl acetonitrile, α-(benzenesulfonyloxyimino)-2,6-dichlorophenyl acetonitrile, α-(benzenesulfonyloxyimino)-2,4-dichlorophenyl acetonitrile, α-(benzenesulfonyloxyimino)-4-methoxyphenyl acetonitrile, α-(2-chlorobenzenesulfonyloxyimino)-4-methoxyphenyl acetonitrile, α-(benzenesulfonyloxyimino)-2-thienyl acetonitrile, α-(4-dodecylbenzenesulfonyloxyimino)phenyl acetonitrile, α-(toluenesulfonyloxyimino)-4-methoxyphenyl acetonitrile, α-(4-dodecylbenzenesulfonyloxyimino)-4-methoxyphenyl acetonitrile, α-(trisulfonyloxyimino)-3-thienyl acetonitrile, α-(benzenesulfonyloxyimino)-4-methoxyphenyl acetonitrile, α-(ethylsulfonyloxyimino)-4-methoxyphenyl acetonitrile, α-(trifluoromethylsulfonyloxyimino)-4-methoxyphenyl acetonitrile, α-(propylsulfonyloxyimino)-4-methoxyphenyl acetonitrile, α-(methylsulfonyloxyimino)-4-bromophenyl acetonitrile, α-(methylsulfonyloxyimino)-1-cyclopentenyl acetonitrile, α-(methylsulfonyloxyimino)-1cyclohexenyl acetonitrile, α-(methylsulfonyloxyimino)-1-cycloheptenyl acetonitrile, α-(methylsulfonyloxyimino)-1-cyclooctynyl acetonitrile, α-(trifluoromethylsulfonyloxyimino)-1-cyclopentenyl acetonitrile, α-(trifluoromethylsulfonyloxyimino)-1-cyclohexenyl acetonitrile, α-(ethylsulfonyloxyimino)ethyl acetonitrile, α-(propylsulfonyloxyimino)propyl acetonitrile, α-(cyclohexylsulfonyloxyimino)cyclopentyl acetonitrile, α-(cyclohexylsulfonyloxyimino)cyclohexyl acetonitrile, α-(cyclohexylsulfonyloxyimino)-1-cyclopentenyl acetonitrile, α-(1-naphthylsulfonyloxyimino)-4-methoxybenzyl cyanide, α-(2-naphthylsulfonyloxyimino)-4-methoxybenzyl cyanide, α-(1-naphthylsulfonyloxyimino) benzyl cyanide, α-(2-naphthylsulfonyloxyimino)benzyl cyanide, α-(10-camphorsulfonyloxyimino)-4-methoxybenzyl cyanide, α-(10-camphorsulfonyloxyimino) benzyl cyanide, α-(3-camphorsulfonyloxyimino)-4-methoxybenzyl cyanide, α-(3-bromo-10-camphorsulfonyloxyimino)-4-methoxybenzyl cyanide, and compounds represented by the following formulae (II)–(XIII);

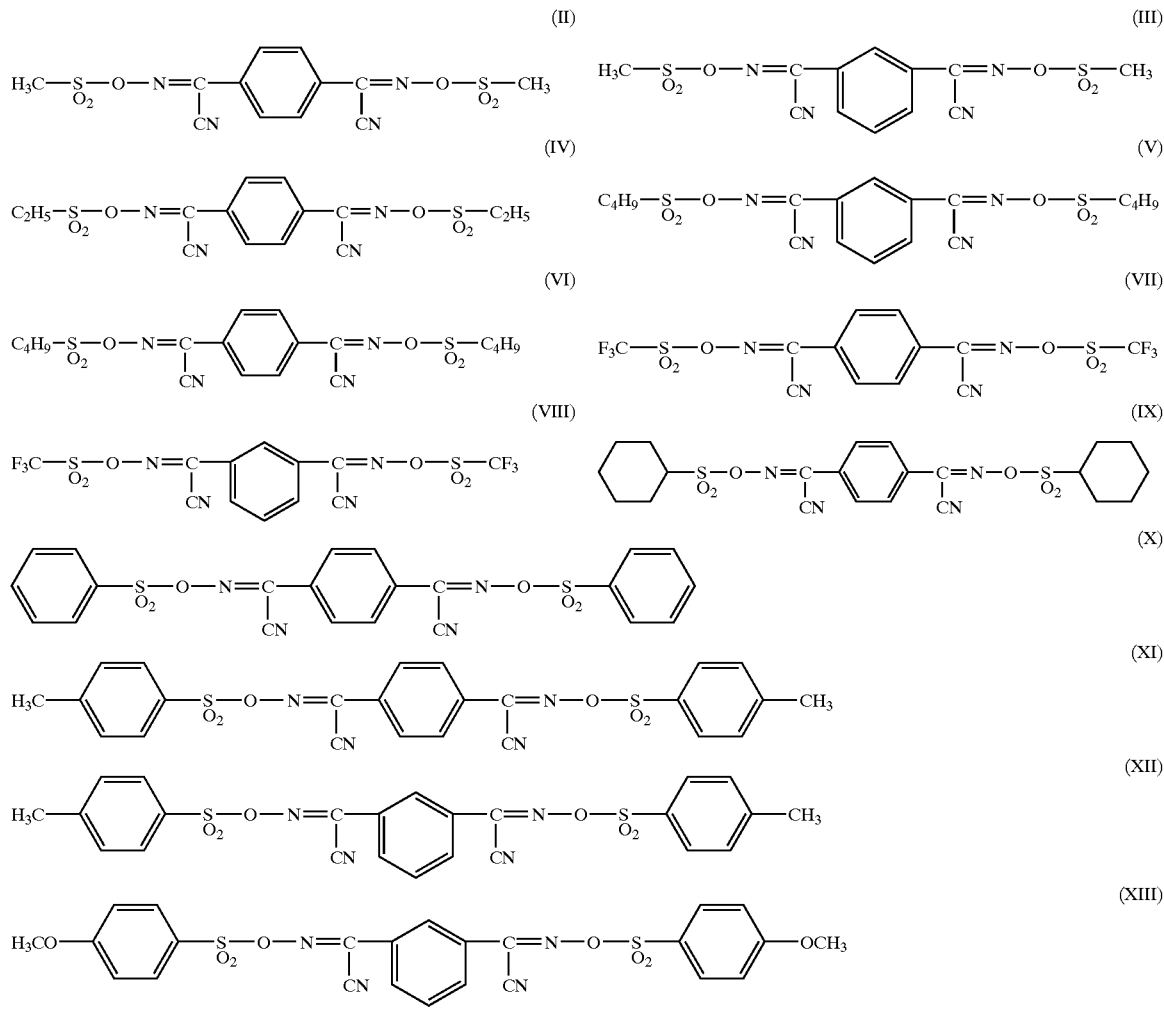

(j) imide compounds, such as N-methylsulfonyloxy succinimide, N-isopropylsulfonyloxy succinimide, N-chloroethylsulfonyloxy succinimide, N-(p-methoxyphenyl)sulfonyloxy succinimide, N-(p-vinylphenyl)sulfonyloxy succinimide, N-naphthylsulfonyloxy succinimide, N-phenylsulfonyloxy succinimide, N-(2,3,6-triphenyl)sulfonyloxy succinimide, N-methylsulfonyloxy maleimide, N-isopropylsulfonyloxy maleimide, N-chloroethylsulfonyloxy maleimide, N-(p-methoxyphenyl)sulfonyloxy maleimide, N-(p-vinylphenyl) sulfonyloxy maleimide, N-naphthylsulfonyloxy maleimide, N-phenylsulfonyloxy maleimide, N-(2,3,6-triphenyl) sulfonyloxy maleimide, N-methylsulfonyloxy phthalimide, N-isopropylsulfonyloxy phthalimide, N-chloroethylsulfonyloxyphthalimide, N-(p-methoxyphenyl)sulfonyloxyphthalimide, N-(p-vinylphenyl) sulfonyloxy phthalimide, N-naphthylsulfonyloxy phthalimide, N-phenylsulfonyloxy phthalimide, and N-(2,3,6-triphenyl)sulfonyloxy phthalimide.

Basically, a compound of the same type as that for use in a photoresist layer that is laid over the anti-reflective coating is preferably employed as the acid-generating agent.

The amount of the acidic compound in the present invention is, if it is an acid, preferably 0.1–20 wt %, particularly 0.5–15 wt % relative to the crosslinking component. If it is an acid-generating agent, its amount is preferred to be 0.1–30 wt %, particularly 0.5–20 wt % relative to the crosslinking component.

Furthermore, in addition to the essential components of the crosslinking agent and the acidic compound described above, a highly light-absorptive component and a binder resin may optionally be incorporated into the composition of the present invention.

The highly light-absorptive component in the present invention is not specifically restricted so long as it shows high absorption ability with respect to light of wavelengths in the photosensitive characteristic region of the photosensitive component contained in the photoresist layer, which is provided on the anti-reflective coating obtainable in the present invention, and is capable of preventing standing waves resulting from the reflection of light at the substrate from giving adverse effects or irregular reflection due to variations in height of the substrate surface. Specific examples of the highly light-absorptive component include salicylate compounds, benzophenone compounds, benzotriazole compounds, cyanoacrylate compounds, azo compounds, polyene compounds, anthraquinone compounds, bisphenyl sulfone compounds, bisphenyl sulfoxide compounds, and anthracene compounds.

In view of solubility in the crosslinking agent or solvent, prevention of intermixing with the substrate, and reaction-promoting effect upon thermal crosslinking by the crosslinking agent, preferable highly light-absorptive components are a benzophenone compound, a bisphenyl sulfone compound, a bisphenyl sulfoxide compound, an anthracene compound, or the like. Among them, preferably employed is at least one hydroxy compound selected from: a benzophenone compound having at least two hydroxyl groups, i.e., a polyhydroxybenzophenone compound; a bisphenyl sulfone compound having at least two hydroxyl groups; a bisphenyl sulfoxide compound having at least two hydroxyl groups; and an anthracene compound having at least one hydroxyl or hydroxyalkyl group. Of these, in the case where a KrF excimer laser beam is employed, the anthracene or bisphenyl sulfone compound is particularly preferred. These can be used either singly or in combination.

Examples of the benzophenone compound having at least two hydroxyl groups, i.e., a polyhydroxybenzophenone compound include 2,4-dihydroxybenzophenone, 2,3,4-trihydroxybenzophenone, 2,2',4,4'-tetrahydroxybenzophenone, 2,2',5,6'-tetrahydroxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-dimethylamino-2'4'-dihydroxybenzophenone, and 4-dimethylamino-3',4'-dihydroxybenzophenone.

As the preferred bisphenyl sulfone or bisphenyl sulfoxide compound having at least two hydroxyl groups, bis(hydroxyphenyl)sulfones, bis(hydroxyphenyl)sulfoxides, bis(polyhydroxyphenyl)sulfones, and bis(polyhydroxyphenyl)sulfoxides are exemplified. Concrete examples thereof include bis(4-hydroxyphenyl)sulfone, bis(3,5-dimethyl-4-hydroxyphenyl)sulfone, bis(4-hydroxyphenyl)sulfoxide, bis(3,5-dimethyl-4-hydroxyphenyl)sulfoxide, bis(2,3-dihydroxyphenyl)sulfone, bis(5-chloro-2,3-dihydroxyphenyl)sulfone, bis(2,4-dihydroxyphenyl)sulfone, bis(2,4-dihydroxy-6-methylphenyl)sulfone, bis(5-chloro-2,4-dihydroxyphenyl)sulfone, bis(2,5-dihydroxyphenyl)sulfone, bis(3,4-dihydroxyphenyl)sulfone, bis(3,5-dihydroxyphenyl)sulfone, -bis(2,3,4-trihydroxyphenyl)sulfone, bis(2,3,4-trihydroxy-6-methylphenyl)sulfone, bis(5-chloro-2,3,4-trihydroxyphenyl)sulfone, bis(2,4,6-trihydroxyphenyl)sulfone, bis(5-chloro-2,4,6-trihydroxyphenyl)sulfone, bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxyphenyl)sulfoxide, and bis(5-chloro-2,4,6-trihydroxyphenyl)sulfoxide.

As the anthracene compound having at least one hydroxyl or hydroxyalkyl group, one that has an anthracene ring and a substituent(s) thermally crosslinkable with the crosslinking agent is usable. Examples of such anthracene compound include those represented by the following general formula (XIV):

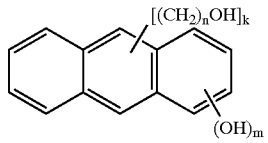

(XIV)

wherein n is an integer of 1–10, m is an integer of 0–8, and k is an integer of 0–6, with the proviso that k and n are not 0 simultaneously.

Exemplary compounds represented by the general formula (XIV) include 1-hydroxyanthracene, 9-hydroxyanthracene, 1,2-dihydroxyanthracene, 1,5-dihydroxyanthracene, 9,10-dihydroxyanthracene, 1,2,3-trihydroxyanthracene, 1,2,3,4-tetrahydroxyanthracene, 1,2,3,4,5,6-hexahydroxyanthracene, 1,2,3,4,5,6,7,8-octahydroxyanthracene, 1-hydroxymethylanthracene, 9-hydroxymethylanthracene, 9-hydroxyethylanthracene, 9-hydroxyhexylanthracene, 9-hydroxyoctylanthracene, 9,10-dihydroxymethylanthracene, 9-anthracene carboxylic acid, 9,10-anthracene dicarboxylic acid, glycidylated anthracene carboxylic acid, glycidylated anthracenyl methyl alcohol, and condensation products of anthracenyl methyl alcohol with polycarboxylic acids (e.g., oxalic acid, malonic acid, methylmalonic acid, ethylmalonic acid, dimethylmalonic acid, succinic acid, methylsuccinic acid, 2,2-dimethylsuccinic acid, glutaric acid, adipic acid, pimelic acid).

Of these, anthracene compounds, particularly 9-anthracene carboxylic acid and 9,10-anthracene dicarboxylic acid are preferred for, in addition to high light-absorbing ability, their satisfying such requirements as high thermal crosslinkability and being less susceptible to intermixing.

The amount of the light-absorptive compound is 50–200 parts by weight, preferably 80–200 parts by weight per 100 parts by weight of the crosslinking agent, and that suitable adjustment may be made according to the type of the crosslinking agent to be employed and the wavelength of light for exposure.

As the binder resin, there are exemplified polyamide acids, polysulfones, halogenated polymers, polyacetals, acetal copolymers, α-substituted vinyl polymers, polyamine acids, polybutenesulfonic acid, and acrylic resins. Of these, acrylic resins having at least one acrylate unit are particularly preferred.

As those acrylic resins, polymers are preferably employed which are obtainable through polymerization of alkyl acrylates, such as glycidyl acrylate, methyl acrylate, ethyl acrylate and propyl acrylate, and 4-(4-hydroxyphenyl)sulfonylphenyl acrylate and corresponding methacrylates thereto. Examples of such polymers include polyglycidyl acrylate, polymethyl acrylate, polyethyl acrylate, poly[4-(4-hydroxyphenyl) sulfonylphenyl]acrylate, the copolymer of glycidyl acrylate and methyl acrylate, and methacrylate polymers or co-polymers corresponding thereto. Among the above compounds, the use of a copolymer having a weight ratio of glycidyl methacrylate to methyl methacrylate of from 2:8 to 8:2, particularly from 7:3 to 3:7 or poly[4-(4-hydroxyphenyl)sulfonylphenyl]methacrylate is advantageous, because the formation of an intermixing layer with a photoresist layer on the anti-reflective layer hardly occurs.

In the case of adding a binder resin, it is preferred that the amount of the crosslinking agent is 3–200 parts by weight, preferably 5–100 parts by weight per 100 parts by weight of the binder resin.

The components described above are dissolved in an organic solvent. The organic solvent may include ketones, such as acetone, methyl ethyl ketone, cyclopentanone, cyclohexanone, methyl isoamyl ketone, 2-heptanone, and 1,1,1-trimethylacetone; polyhydric alcohols and derivatives thereof, such as ethylene glycol, ethylene glycol monoacetate, diethylene glycol or diethylene glycol monoacetate, propylene glycol, propylene glycol monoacetate, monomethyl-, monoethyl-, monopropyl-, monobutyl-, and monophenyl ethers thereof; cyclic ethers such as dioxiane; esters such as ethyl lactate, methyl acetate, ethyl acetate, butyl acetate, methyl pyruvate, ethyl pyruvate, methyl 3-methoxypropionate, and ethyl 3-ethoxypropionate. These can be used either singly or in combination.

The organic solvent is incorporated into the composition of the present invention so that the concentration of the resulting solution is 1–15 wt %, preferably 3–10 wt % relative to the total amount of the solid components.

Moreover, for improving the coatability or preventing striation, a surfactant may optionally be added to the composition of the present invention. Examples of such surfactants include fluorine-containing surfactants known under the tradenames Surflons SC-103 and SR-100 (each a product by Asahi Glass Co., Ltd.), EF-351 (a product by Tohoku Hiryo Co., Ltd.) and Florads Fc-431, Fc-135, Fc-98, Fc-430 and Fc-176 (each a product by Sumitomo 3M Limited), and its amount should suitably be selected so as to be less than 2,000 ppm based on the solid matter content of the composition of the present invention.

The anti-reflective coating composition of the present invention is used for forming an anti-reflective coating as an undercoating layer of the photoresist layer, and any photoresist, regardless of whether it is of the negative-working type or positive-working type, is employable as the photoresist as the upper layer, provided that it can be developed with an alkaline aqueous solution. Examples of such photoresist include, but are not limited to, (i) a positive-working photoresist including a naphthoquinone diazide compound and a novolak resin, (ii) a positive-working photoresist including a compound which generates an acid upon exposure to light, a compound the solubility in an alkaline aqueous solution of which is increased upon decomposition by an acid, and an alkali-soluble resin, (iii) a positive-working photoresist including a compound which generates an acid upon exposure to light and an alkali-soluble resin having a group which, when decomposed by an acid, raises the solubility in an alkaline aqueous solution, and (iv) a negative-working photoresist including a compound which generates an acid upon exposure to light, a crosslinking agent, and an alkali-soluble resin. In the present invention, any of the above-described chemically amplified photoresists (ii)-(iv) is preferably employed.

One embodiment of the process of forming a pattern, which is a suitable way of use of the anti-reflective coating composition of the present invention, will be described hereinafter. Firstly, a solution prepared by dissolving the composition of the present invention in any of the organic solvents described above is spin-coated onto a substrate using a spinner or the like, and then heat-treated at a temperature of 100–300° C. to form an undercoating layer having a film thickness of 0.03–0.5 $\mu$m. At a temperature within the range mentioned above, the undercoating material of the present invention undergoes crosslinking and thus becomes insoluble in an alkaline solution. After a layer of the undercoating material (anti-reflective coating) has been formed in the manner described above, a photoresist layer is provided thereon through spin coating with a spinner and dried. Using a stepper or the like, the photoresist layer is irradiated with rays, such as KrF or ArF excimer laser beam, through a desired mask pattern. Thereafter, the photoresist layer is heat-treated and developed with a developing agent, such as an alkaline aqueous solution typified by a 1–10 wt % aqueous solution of tetramethylammonium hydroxide (TMAH), whereby the exposed areas if the photoresist is of the positive-working type, or the non-exposed areas if the resist is of the negative-working type, are selectively dissolved and removed, leaving a photoresist pattern precisely etched so as to correspond to the mask. The use of the anti-reflective coating composition of the present invention realizes, even in the case of a hyperfine pattern with a line width of about 0.20 to 0.22 $\mu$m, the formation of a photoresist pattern having an excellent profile.

EXAMPLES

Hereinafter, the present invention will be described in further detail based on the following examples, but these should by no means be construed as restricting the scope of the present invention.

Example 1

Crosslinking Agent (Reduced in Low-molecular-weight Fraction Content)+acid+Organic Solvent An anti-reflective coating composition was prepared by dissolving 10 g of a benzoguanamine compound available as BX-55H (a product of Sanwa Chemical Co., Ltd.) fractionated with methanol and 0.5 g of p-toluenesulfonic acid in 252 g of propylene glycol monomethyl ether.

Analysis of the methanol-separated BX-55H by GPC using "GPC System-21" (manufactured by Shodex Co.) showed that the content of a low-molecular-weight fraction, in other words, a low-molecular-weight component having a molecular weight of not more than 800, was 0.11 wt %.

GPC was carried out by allowing 20 $\mu$l of a 0.1 wt % THF solution to pass through the above-described apparatus at a flow rate of 0.6 ml/min. for 20 minutes and measuring the time taken by the sample detected at a UV wavelength $\lambda$ of 280 nm or so to elute. A 6.0 mm×150 mm column "TSK-Gel Super HM-N" (manufactured by Tosoh Co., Ltd.) and a 4.6 mm×35 mm guard column "TSK-Guard Column Super H-H" (manufactured by Tosoh Co., Ltd.) were employed, and the separation temperature was set at 40° C.

Thereafter, the anti-reflective coating composition was applied onto a silicon wafer using a spinner and heated at 180° C. for one minute to give an anti-reflective coating layer having a film thickness of 0.1 $\mu$m.

Then, a film of a chemically amplified positive-working type photoresist composition "TDUR-DP604" (manufactured by Tokyo Ohka Kogyo Co., Ltd.) was provided on the anti-reflective coating layer described above.

After having been exposed to light through a pattern-bearing mask using a stepper "Nikon NSR-2005EX8A" (manufactured by Nikon Corp), the wafer was baked on a hot plate at 130° C. for 90 seconds, developed with a 2.38 wt % aqueous solution of tetramethylammonium hydroxide (TMAH), and washed with pure water to give a photoresist pattern (line width: 0.15 $\mu$m).

The cross-sectional profile of the bottom part of the patterned photoresist as examined by SEM (scanning electron microscope) was such that its side walls stood upright to the substrate.

Example 2

Crosslinking Agent (Reduced in Low-molecular-weight Fraction Content)+Acid-generating Agent+ highly Light-absorptive Component+Organic Solvent An anti-reflective coating composition was prepared by dissolving 10 g of a melamine compound MX-788 (manufactured by Sanwa Chemical Co., Ltd.) fractionated with methanol, 2 g of anthracene carboxylic acid, and 1 g of an onium salt-based acid-generating agent TPS-105 (a product of Midori Kagaku Co., Ltd.) in 312 g of propylene glycol monomethyl ether.

The proportion of the low-molecular-weight fraction, i.e., the low-molecular-weight component with a molecular weight of 500 or less, contained in this melamine compound was 8.12 wt %.

Then, the same procedure as that in Example 1 was followed to provide a photoresist pattern.

The cross-sectional profile of the bottom part of the patterned photoresist as examined by SEM (scanning electron microscope) was such that its side walls stood upright to the substrate.

Example 3

Crosslinking Agent (Reduced in Low-molecular-weight Fraction Content)+acid+Acid-generating Agent+Organic Solvent An anti-reflective coating composition was prepared by dissolving 10 g of a benzoguanamine compound BX-55H (manufactured by Sanwa Chemical Co., Ltd.) fractionated with methanol, 0.5 g of p-toluenesulfonic acid, and 0.5 g of an acid-generating agent TPS-105 (a product of Midori Kagaku Co., Ltd.) in 264 g of propylene glycol monomethyl ether.

The proportion of the low-molecular-weight fraction, i.e., the low-molecular-weight component having a molecular weight of 800 or less, contained in this benzoguanamine compound was 0.11 wt %.

Then, the same procedure as that in Example 1 was followed to form a photoresist pattern.

The cross-sectional profile of the bottom part of the patterned photoresist as examined by SEM (scanning electron microscope) was such that its side walls stood upright to the substrate.

Example 4

Crosslinking Agent (Reduced in Low-molecular-weight Fraction Content)+Acid-generating Agent+ Binder Resin+Organic Solvent An anti-reflective coating composition was prepared by dissolving 2 g of a benzoguanamine compound BX-55H (a product of Sanwa Chemical Co., Ltd.) fractionated with methanol, 8 g of an acrylic resin PAC-101 (manufactured by Daito Chemix Co.), and 1 g of an onium salt-based acid-generating agent TPS-105 (a product of Midori Kagaku Co., Ltd.) in 264 g of propylene glycol monomethyl ether.

The proportion of the low-molecular-weight fraction, i.e., the low-molecular-weight component having a molecular weight of 800 or less, contained in this benzoguanamine compound was 0.11 wt %.

Then, the same procedure as that in Example 1 was followed to provide a photoresist pattern.

The cross-sectional profile of the bottom part of the resulting photoresist pattern as examined by SEM (scanning electron microscope) was such that its side walls stood upright to the substrate.

Comparative Example 1

Crosslinking Agent+Acid+Organic Solvent

The same procedure as that in Example 1 was followed to form a photoresist pattern, except for the use of, as the crosslinking agent, 10 g of a benzoguanamine compound containing 23 wt % of a low-molecular-weight fraction (a fraction with a molecular weight of 800 or less) available under the tradename BX-55H (manufactured by Sanwa Chemical Co., Ltd.).

Examination of the patterned photoresist thus obtained by SEM (scanning electron microscope) showed that its cross-sectional profile was an upwardly tapered one.

Comparative Example 2

Crosslinking Agent+Acid-generating Agent+Highly Light-absorptive Component+Organic Solvent The same procedure as that in Example 2 was followed to form a photoresist pattern, except for the use of, as the crosslinking agent, 10 g of a melamine compound containing 46.2 wt % of a low-molecular-weight fraction (a fraction with a molecular weight of 500 or less) available under the tradename MX-788 (manufactured by Sanwa Chemical Co., Ltd.).

Examination of the patterned photoresist thus obtained by SEM (scanning electron microscope) showed that its cross-sectional profile was an upwardly tapered one.

Comparative Example 3

Crosslinking Agent+Acid+Acid-generating Agent+ Organic Solvent

The same procedure as that in Example 3 was followed to provide a photoresist pattern, except for the use of, as the crosslinking agent, 10 g of a benzoguanamine compound containing 23.49 wt % of a low-molecular-weight fraction (a fraction having a molecular weight of 800 or less) available under the tradename BX-55H (a product of Sanwa Chemical Co., Ltd.).

Examination of the patterned photoresist thus obtained by SEM (scanning electron microscope) showed that its cross-sectional profile was an upwardly tapered one.

Comparative Example 4

Crosslinking Agent+Acid-generating Agent+Binder Resin+Organic Solvent

The same procedure as that in Example 4 was followed to provide a photoresist pattern, except for the use of, as the crosslinking agent, 2 g of a benzoguanamine compound containing 23.49 wt % of a low-molecular-weight fraction (a fraction with a molecular weight of 800 or less) available under the tradename BX-55H (a product of Sanwa Chemical Co., Ltd.).

Examination of the patterned photoresist thus obtained by SEM (scanning electron microscope) showed that its cross-sectional profile was an upwardly tapered one.

As was described above in detail, even when forming a hyperfine pattern using a short-wavelength light source ranging from vacuum ultraviolet ray to extreme-ultraviolet ray typified by excimer laser beams for finer processing, the present invention provides an anti-reflective coating composition which enables the formation of a photoresist pattern having a rectangular profile in relation to the substrate without causing footing nor T-topping at its bottom.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An anti-reflective coating composition comprising a crosslinking agent, which is at least one compound selected from nitrogen-containing compounds having an amino group(s) and/or an imino group(s) at least two hydrogen atoms of which are substituted by a hydroxyalkyl group(s) and/or an alkoxyalkyl group(s), and an acidic compound, said crosslinking agent being such that the proportion of a low-molecular-weight component not larger than a trimer contained therein is adjusted to be 15 wt % or less.

2. The anti-reflective coating composition according to claim 1, wherein the crosslinking agent is at least one compound selected from the group consisting of a benzoguanamine compound, a guanamine compound, a melamine compound, and a urea compound.

3. The anti-reflective coating composition according to claim 1, wherein the crosslinking agent is a benzoguanamine compound and the proportion of a low-molecular-weight fraction with a molecular weight of 800 or less contained therein is adjusted to be 15 wt % or less.

4. The anti-reflective coating composition according to claim 1, wherein the crosslinking agent is a melamine compound and the proportion of a low-molecular-weight fraction with a molecular weight of 500 or less contained therein is adjusted to be 15 wt % or less.

5. The anti-reflective coating composition according to claim 1, wherein the acidic compound is at least one compound selected from the group consisting of an inorganic or organic acid having a sulfur-containing acid residue, an ester thereof, and an acid-generating agent.

6. A multilayer photoresist material comprising an anti-reflective coating formed onto a substrate using the anti-reflective coating composition recited in any of claims 1–5, and a photoresist layer provided thereon.

7. A method for forming a pattern, comprising:

forming an anti-reflective coating onto a substrate using the anti-reflective coating composition recited in any of claims 1–5;

providing a photoresist layer thereon;

selectively exposing the photoresist layer to light; and developing the photoresist layer to provide a photoresist pattern.

8. The method for forming a pattern according to claim 7, wherein a line width of the photoresist pattern is 0.22 $\mu$m or less.

* * * * *